United States Patent [19]

Engelen et al.

[11] Patent Number: 5,280,178
[45] Date of Patent: Jan. 18, 1994

[54] SPECIMEN HOLDER FOR USE IN A CHARGED PARTICLE BEAM DEVICE

[75] Inventors: Andreas Th. Engelen; Peter E. S. J. Asselbergs; Johannes A. C. Cooijmans, all of Eindhoven, Netherlands

[73] Assignee: U.S. Philips Corporation, New York, N.Y.

[21] Appl. No.: 851,446

[22] Filed: Mar. 16, 1992

[30] Foreign Application Priority Data

Mar. 18, 1991 [EP] European Pat. Off. ........ 91200583.2

[51] Int. Cl.⁵ .............................................. H01J 37/20
[52] U.S. Cl. ......................... 250/440.11; 250/442.11
[58] Field of Search ................. 250/440.11, 442.11; 359/391, 398

[56] References Cited

U.S. PATENT DOCUMENTS 3,446,960  5/1969  Sciacca et al. ............... 250/442.11
4,596,934  6/1986  Yanaka et al. ................ 250/442.1

FOREIGN PATENT DOCUMENTS 63-193450  12/1988  Japan .
89/01698   2/1989   World Int. Prop. O. ...... 250/440.11

Primary Examiner—Jack I. Berman
Attorney, Agent, or Firm—William L. Botjer

[57] ABSTRACT

A specimen holder for use in a charged particle beam device, notably an electron microscope, comprises a support and a resilient retaining element. The retaining element comprises a resilient ring which can be detached from the support or resilient tags which are attached to the support. A specimen is pressed against the support by the resilient retaining element. Such retaining of the specimen offers the advantage that the specimen can be readily disposed on the comparatively thin support and can be simply detached therefrom with a minimum risk of damaging.

8 Claims, 2 Drawing Sheets

SPECIMEN HOLDER FOR USE IN A CHARGED PARTICLE BEAM DEVICE

BACKGROUND OF THE INVENTION

The invention relates to a specimen holder for use in a charged particle beam device, comprising:
a support having a supporting face and a circumferential edge which extends transversely of the supporting face, and
a resilient retaining element for retaining a specimen between the retaining element and the supporting face.

The invention also relates to a support and a retaining element suitable for use in a specimen holder of this kind, and also to a charged particle beam device comprising such a specimen holder.

A specimen holder of the kind set forth is known from U.S. Pat. No. 4,596,934.

The cited patent specification describes a specimen holder of a high-resolution electron microscope, which holder comprises a support having a supporting face on which a mesh-covered ring can be arranged. The ring is retained by means of a ring-shaped spring. The supporting face is recessed relative to a top face of the support, thus forming an upright edge which surrounds the ring. In the upright edge a slot is recessed above the mesh-covered ring, the ring-shaped spring fitting in said slot. Displacement of the mesh-covered ring in a direction perpendicular to the supporting face is prevented by expansion of the ring-shaped spring in the slot. Such a construction has the drawback that the removal of the resilient ring from the slot is difficult, the more so because the dimensions of the support amount to only a few millimeters.

SUMMARY OF THE INVENTION

It is inter alia an object of the invention to provide a specimen holder comprising a support of comparatively small dimensions, for example a thickness of 1 mm, which enables simple retaining and removal of a specimen and which prevents damaging of the specimen. To achieve this, a specimen holder in accordance with the invention is characterized in that when a specimen is disposed between the supporting face and the retaining element, the retaining element exerts a spring force on the specimen which is directed transversely of the supporting face.

The resilient retaining element presses the specimen against the supporting face, so that it retains its position upon rotation and translation of the specimen holder. The specimen can be arranged on the support or be removed therefrom by lifting the retaining element or by pushing it upwards against its spring force. Specimens of equal thickness are clamped against the supporting face with the same, reproducible force. Damaging of the specimen by excessive pressure is prevented by a suitable choice of a retaining element having a sufficiently small spring constant (for example, 0.1 m/m); damaging is not always precluded in known retaining constructions where the specimen is clamped against the support by way of adjusting screws.

An embodiment of a specimen holder in accordance with the invention is characterized in that the retaining element comprises a contact portion which extends along the supporting face and at least two lugs which extend transversely of the contact portion and which resiliently bear against the circumferential edge.

The retaining element can be completely detached from the support and can be simply attached to the support by pressing it onto the support, the circumferential edge then pressing the lugs apart so that they are clamped against the circumferential edge. Because the lugs are readily accessible, the retaining element can be simply detached, for example by pressing the lugs upwards along the circumferential edge to a level beyond the supporting face.

Another embodiment of a specimen holder in accordance with the invention is characterized in that the retaining element comprises a central portion and at least two arms which extend from the central portion to the circumferential edge of the support and whose ends are turned over so as to constitute the lugs, the supporting face comprising a number of positioning edges extending transversely of the supporting face.

An upright positioning edge which keeps the retaining element in position is obtained by providing the support with a recess in the form of the circumference of the retaining element, which recess extends as far as the circumferential edge of the support at the area of the arms of the retaining element.

A further embodiment of a specimen holder in accordance with the invention, in which the support comprises a hole for the passage of a charged particle beam, is characterized in that the central portion of the retaining element has an annular shape and is attached to the support so as to surround the hole.

A suitable clamping effect is obtained by way of a retaining element having an annular contact portion which is arranged around the hole in the support and which comprises three arms whose ends are turned over through an angle of more than 90°.

A further embodiment of a specimen holder in accordance with the invention is characterized in that the support comprises a further hole which opens into the portion of the supporting face of the support which is covered by an arm of the retaining element.

Through the further hole the retaining element can be pressed loose, using a pin, from the side of the support which faces the supporting face. In order to detach the retaining element, alternatively one of the lugs may be provided with a detachment portion which extends transversely of the lugs.

Another embodiment yet of a specimen holder in accordance with the invention is characterized in that the retaining element comprises two resilient tongues which extend along the supporting face, one end of each tongue being connected to the supporting face.

A specimen can be simply slid underneath the resilient tongues in a direction extending along the supporting face, said tongues then clamping the specimen against the supporting face. Because the resilient retaining elements are connected to the support, they will not be lost.

Another embodiment of a specimen holder in accordance with the invention is characterized in that the support comprises a shaft which extends transversely of the circumferential edge and about which the support can be tilted.

The number of possibilities for the positioning of the specimen attached to the support is increased by rotation of the support about the shaft. The rotation is transmitted to the support, for example by a pushrod in the specimen holder or by a piezoelectric element. The shaft may be rigidly connected to the support and may be rotatably connected to the specimen holder via a bearing. The shaft may alternatively be rigidly connected to the specimen holder and be connected to the support via a bearing provided in the circumferential edge.

BRIEF DESCRIPTION OF THE DRAWING

Some embodiments of a specimen holder in accordance with the invention will be described in detail hereinafter with reference to the accompanying drawing. Therein.

DETAILED DESCRIPTION OF THE PREFERRED EMBODIMENT

Figure 1:
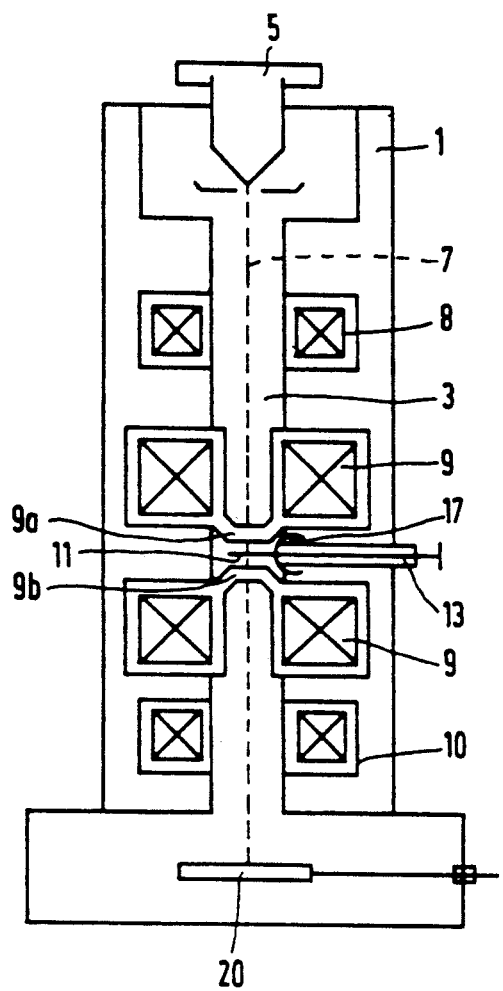
FIG. 1 shows diagrammatically an electron microscope comprising a specimen holder.

FIG. 1 shows a charged particle beam device, notably an electron microscope 1, comprising a column 3 which can be evacuated, for example to $10^{-7}$ Torr. An electron source 5 emits an electron beam along an optical axis 7, which beam is imaged on a specimen 11 by way of a dual condensor system 8 and an objective lens 9. The lower portion of the objective lens 9, a diffraction lens, an intermediate lens and two projector lenses, all diagrammatically represented by the lens 10, form an image of the specimen 11 on a target 20 with a magnification of, for example $10^6$. The specimen 11 is supported by a specimen holder 13. Via a spherical bearing 17, the specimen holder 13 is connected to the column 3 so that the specimen holder can be displaced relative to the optical axis 7 in a direction along the optical axis 7 over a distance of, for example 1 mm and also over a distance of approximately 1 mm in direction which is not situated in the plane of drawing. The specimen 11 is tilted by rotation of the specimen holder 13 about its axis. Tilting of the specimen is important, for example in order to obtain a number of images of the specimen 11 with different orientations for reconstruction of a three-dimensional image, examination of diffraction images of the specimen 11, or for optimizing the signal from an X-ray detector which can be arranged adjacent the upper poleshoe 9a of the objective lens 9 and which detects the X-rays generated in the specimen by the electron beam in the case of material analysis of the specimen 11.

According to the Rayleigh theory, the dimension of the smallest observable details in the specimen 11 is proportional to $\lambda/\alpha$, where $\alpha$ is the numerical aperture of the objective lens 9 and $\lambda$ is the wavelength of the electrons. For an electron energy amounting to 300 kV, the wavelength amounts to approximately $2.10^{-3}$ nm. Because of the spherical aberration caused by the objective lens 9, such a resolution cannot be achieved because a point situated on the optical axis 7 is imaged by the objective lens 9 as a spot having a diameter which is proportional to $C_S\alpha^3$. Therein, $C_S$ is the spherical aberration coefficient. A minimum resolution is obtained when the numerical aperture $\alpha$ is chosen between an as low as possible value for reducing the spherical aberration and an as high as possible value for maximizing the resolution according to Rayliegh. The dimension of the smallest observable details is then $0.67 C_S^{\frac{1}{4}}\lambda^{\frac{3}{4}}$. For high-resolution electron microscopes a resolution of 0.17–0.20 nm can be achieved for a spherical aberration coefficient value of 1 mm. Such a low aberration coefficient can be achieved by making the distance between the poleshoes 9a and 9b equal to 1 mm. Because of the small poleshoe distance required for a high-resolution, a part of the specimen holder to be introduced between the poleshoes must be very thin. Moreover, the specimen holder must be sufficiently rigid to prevent image-disturbing vibrations of the specimen and it must also be possible to attach a specimen which comprises, for example a carbon film having a thickness of 20 nm, to the specimen holder in a simple manner without causing damage.

Figure 2:
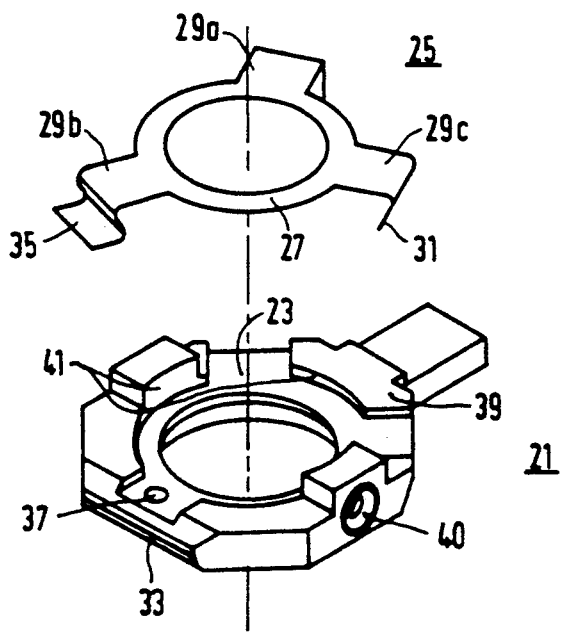
FIGS. 2 and 3 are an isometric representation of a support and a retaining element in accordance with the invention.

FIG. 2 shows a support 21 which can be connected to an end of the specimen holder 13 and which comprises a supporting face 23 on which a specimen can be arranged. A specimen can be clamped against the supporting face 23 by a resilient retaining element 25 which comprises a contact portion in the form of an annular central portion 27 and three arms 29a, 29b and 29c. Each of the arms 29 comprises a lug 31 which can resiliently engage a circumferential edge 33 of the support 21. For detachment purposes one of the lugs 31 is provided with a detachment portion 35 which extends transversely of the tag. Instead of a detachment portion 35, the support 21 may be provided with a hole 37 via which the retaining element 25 can be detached from the support 21 by inserting a pin from the lower side of the support 21. The positioning of the retaining element 25 is facilitated in that the supporting face 23 is recessed relative to an upper surface 39 of the support 21, so that the retaining element 25 bears against the upright positioning edge 41.

Figure 3:
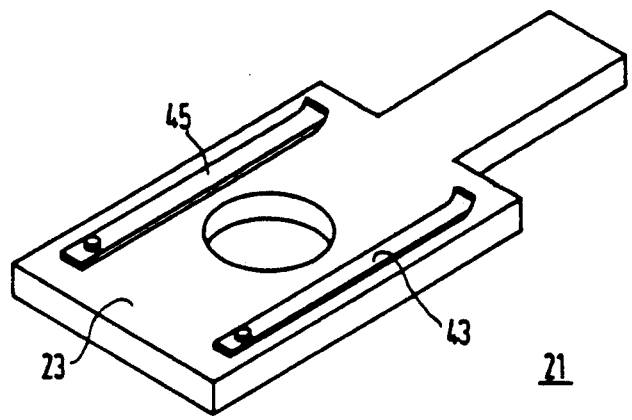

FIG. 3 shows a support 21 where the retaining element is formed by two resilient lugs 43 and 45, one end of which is rigidly connected to the supporting face 23. The lugs 43 and 45 are turned over at one end, so that a speciment can readily slid underneath the tags.

Figure 4:
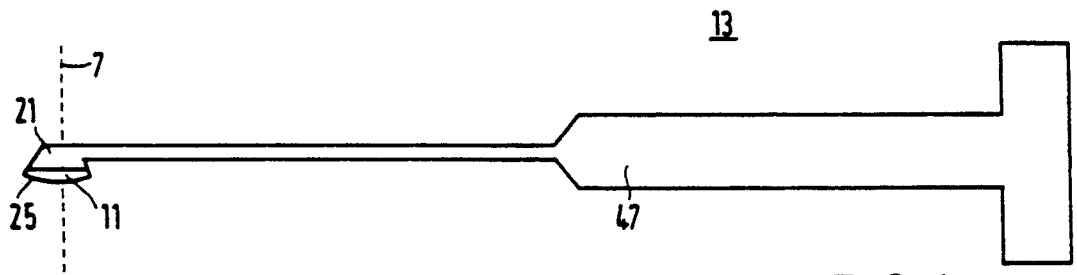
FIG. 4 shows diagrammatically a specimen holder comprising a support and a retaining element in accordance with the invention.

FIG. 4 shows a specimen holder 13 comprising a rod-shaped member 47, the support 21 being secured to one end thereof. The specimen holder 13 can be arranged in a goniometer of the electron microscope 1, the part of the specimen holder 13 with the support 21 being introduced into the evacuated column 3 via an air lock. The hole in the support is then arranged around the optical axis 7 and the specimen 11 is suspended as if it were upside down in the electron beam.

Figure 5:
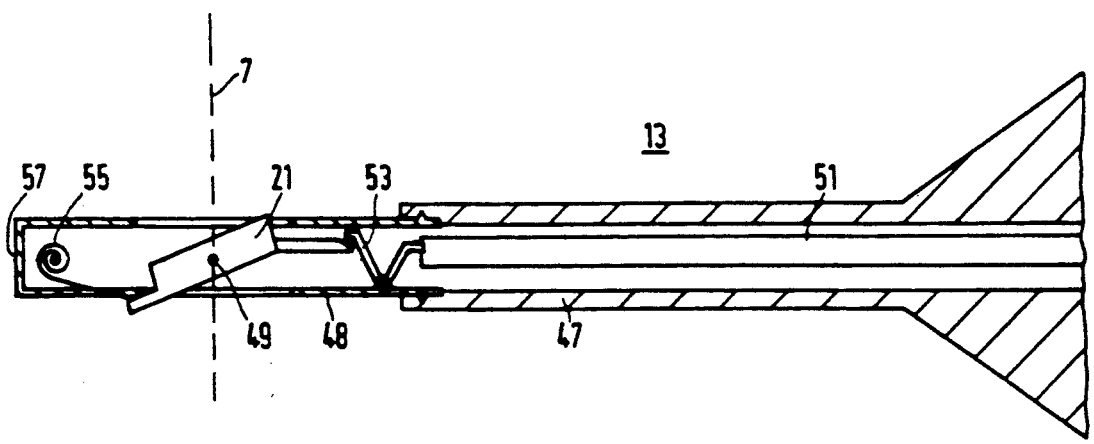
FIG. 5 is a lateral sectional view of a support which is tiltable about two axes.

FIG. 5 shows the specimen holder 13 with the support 21 connected to a tip 48 which is detachable from the specimen holder 13. The support 21 is connected to a shaft 49 which extends perpendicularly to the plane of drawing; the support can be tilted about said shaft by means of a pushrod 51 and a tilting member 53. A resilient element 55 then presses against the support 21 and inter alia provides play-free positioning of the support and rotation of the support 21 upon withdrawal of the pushrod 51. The longitudinal axis 57 of the specimen holder 13 intersects the shaft 49, the point of intersection being situated on the optical axis 7. An object situated at the point of intersection will be situated within the electron beam in all positions of the support, so that the specimen motion is eucentric.

We claim:

1. A specimen holder for use in a charged particle beam device, comprising:
    a support having a supporting face and a circumferential edge which extends transversely of the supporting face, and
    a resilient retaining element having a flat contact portion which extends along the supporting face of the support and at least two resilient lugs which extend transversely of the contact portion and which bear against the circumferential edge of the support for retaining a specimen between the retaining element and the supporting face, and when a specimen is disposed between the supporting face and the retaining element, the retaining element exerts a spring force on the specimen which is directed transversely of the supporting face.

2. A specimen holder as claimed in claim 1, characterized in that the retaining element comprises a central portion and at least two arms which extend from the central portion to the circumferential edge of the support and whose ends are turned over so as to constitute the lugs, the supporting face comprising a number of positioning edges extending transversely of the supporting face.

3. A specimen holder as claimed in claim 2, in which the support comprises a hole for the passage of a charged particle beam, characterized in that the central portion of the retaining element has an annular shape and is attached to the support so as to surround the hole.

4. A specimen holder as claimed in claim 2, characterized in that the retaining element comprises three arms.

5. A specimen holder as claimed in claim 2, characterized in that the support comprises a further hole which opens into the part of the supporting face of the support which is covered by an arm of the retaining element.

6. A specimen holder as claimed in claim 1, characterized in that at least one of the lugs (31) comprises a detachment portion which extends transversely of the at least one lug.

7. A specimen holder as claimed in claim 1, characterized in that the support comprises a shaft which extends transversely of the circumferential edge and about which the support can be tilted.

8. A specimen holder as claimed in claim 7, characterized in that the support is connected to the shaft via two bearings in the circumferential edge.

* * * * *